United States Patent

Roitman

Patent Number: 6,087,771
Date of Patent: Jul. 11, 2000

[54] ELECTROLUMINESCENT DISPLAY AND METHOD FOR MAKING THE SAME

[75] Inventor: Daniel B. Roitman, Menlo Park, Calif.

[73] Assignee: Agilent Technologies, Inc., Palo Alto, Calif.

[21] Appl. No.: 09/387,205

[22] Filed: Aug. 31, 1999

Related U.S. Application Data

[62] Division of application No. 08/874,693, Jun. 13, 1997, Pat. No. 5,972,419.

[51] Int. Cl.⁷ .................................................. H05B 33/14
[52] U.S. Cl. ............................................ 313/503; 428/917
[58] Field of Search ..................................... 313/503, 504, 313/502; 315/169.3; 428/690, 917; 252/301.16, 301.4 R

[56] References Cited

U.S. PATENT DOCUMENTS

| | | | |
|---|---|---|---|
| 4,717,606 | 1/1988 | Hale | 418/690 X |
| 5,932,327 | 8/1999 | Igonuchi et al. | 313/503 X |

*Primary Examiner*—Ashok Patel

[57] ABSTRACT

In the method of the present invention, a bottom electrode having a planar sheet of conducting material is first deposited on a substrate. A mask is then deposited on the bottom electrode to define wells. For at least first and second ones of the wells defined by the mask, an electroluminescent material is dispensed into the wells. The electroluminescent material dispensed into the first well emits a different spectrum of light from the electroluminescent material dispensed into the second well. In one embodiment of the invention, an isolation layer is deposited over the electroluminescent material after the electroluminescent material has dried. A top electrode is then deposited over the isolation layer. In a display according to the present invention, a plurality of pixels are deposited on a bottom electrode and then a top electrode is provided for energizing the pixels. The plurality of pixels includes first and second pixels, the first pixel having a first mixture of at least two electroluminescent dyes and the second pixel having a second mixture of the electroluminescent dyes. The first mixture differs in the ratios of the electroluminescent dyes from the second mixture.

2 Claims, 2 Drawing Sheets

ELECTROLUMINESCENT DISPLAY AND METHOD FOR MAKING THE SAME

CROSS REFERENCE TO RELATED APPLICATION(S)

This is a divisional of application Ser. No. 08/874,693 filed on Jun. 13, 1997 now U.S. Pat. No. 5,972,419.

FIELD OF THE INVENTION

The present invention relates to display devices, and more particularly, to displays utilizing polymer-based electroluminescent devices.

BACKGROUND OF THE INVENTION

Polymer-based electroluminescent devices (PLEDs) have the potential for providing inexpensive alternatives to semiconductor-based LEDs. PLEDs may be fabricated by coating the appropriate surfaces with an organic polymer, and hence, do not require the use of high cost fabrication systems such as those utilized in the fabrication of semiconductor devices. A simple PLED may be constructed from an electroluminescent layer sandwiched between an electron injection electrode and a hole injection electrode. More complicated devices utilize electron and hole transport layers between the above mentioned electrodes and the electroluminescent layer.

In spite of the lower construction costs inherent in PLEDs, multicolor displays based on such devices are still quite costly to fabricate. To construct a multicolor display, a patterned deposition of each of a plurality of electroluminescent compounds must be performed. In prior art fabrication systems, a series of masking operations is required to protect the areas that are not to receive a particular electroluminescent compound. The electroluminescent compound is then deposited using vapor deposition, dipping, or spin casting. The mask is then removed and the next mask constructed using conventional photo-resist techniques. Each masking operation increases the fabrication costs and reduces the device yield. Hence, it is advantageous to avoid steps that require masking.

The range of colors that may be generated by a display depends on the range of intensities that can be generated by each color of PLED. In conventional multicolor displays, each pixel of the picture is generated by controlling the intensity of each of three sub-pixels, one for each of the primary colors. If a particular electroluminescent dye has a limited dynamic range, the resulting pixel of the image will be limited to less than the full range of colors.

Finally, it is difficult to generate inexpensive displays that display a single fixed image of the type used in point of sale advertising. If a conventional display is used, the image must be stored in a memory external to the display and the display operated in a mode in which the stored image is continuously scanned into the display. The pixels of the display must be individually addressable which further increases the cost of the display.

Broadly, it is the object of the present invention to provide an improved display based on PLEDs.

It is a further object of the present invention to provide a display that may be more inexpensively fabricated than prior art displays.

It is a still further object of the present invention to provide an improved method for fabricating PLED displays.

These and other objects of the present invention will become apparent to those skilled in the art from the following detailed description of the invention and the accompanying drawings.

SUMMARY OF THE INVENTION

The present invention is a method for constructing an electroluminescent display and a novel display constructed thereby. In the method of the present invention, a bottom electrode having a planar sheet of conducting material is first deposited on a substrate. A mask is then deposited on the bottom electrode to define wells. For at least first and second ones of the wells defined by the mask, an electroluminescent material is dispensed into the wells. The electroluminescent material dispensed into the first well emits a different spectrum of light from the electroluminescent material dispensed into the second well. In one embodiment of the invention, an isolation layer is deposited over the electroluminescent material after the electroluminescent material has dried. A top electrode is then deposited over the isolation layer. In a display according to the present invention, a plurality of pixels are deposited on a bottom electrode and then a top electrode is provided for energizing the pixels. The plurality of pixels includes first and second pixels, the first pixel having a first mixture of at least two electroluminescent dyes and the second pixel having a second mixture of the electroluminescent dyes. The first mixture differs in the ratios of the electroluminescent dyes from the second mixture.

DETAILED DESCRIPTION OF THE INVENTION

Figure 1:
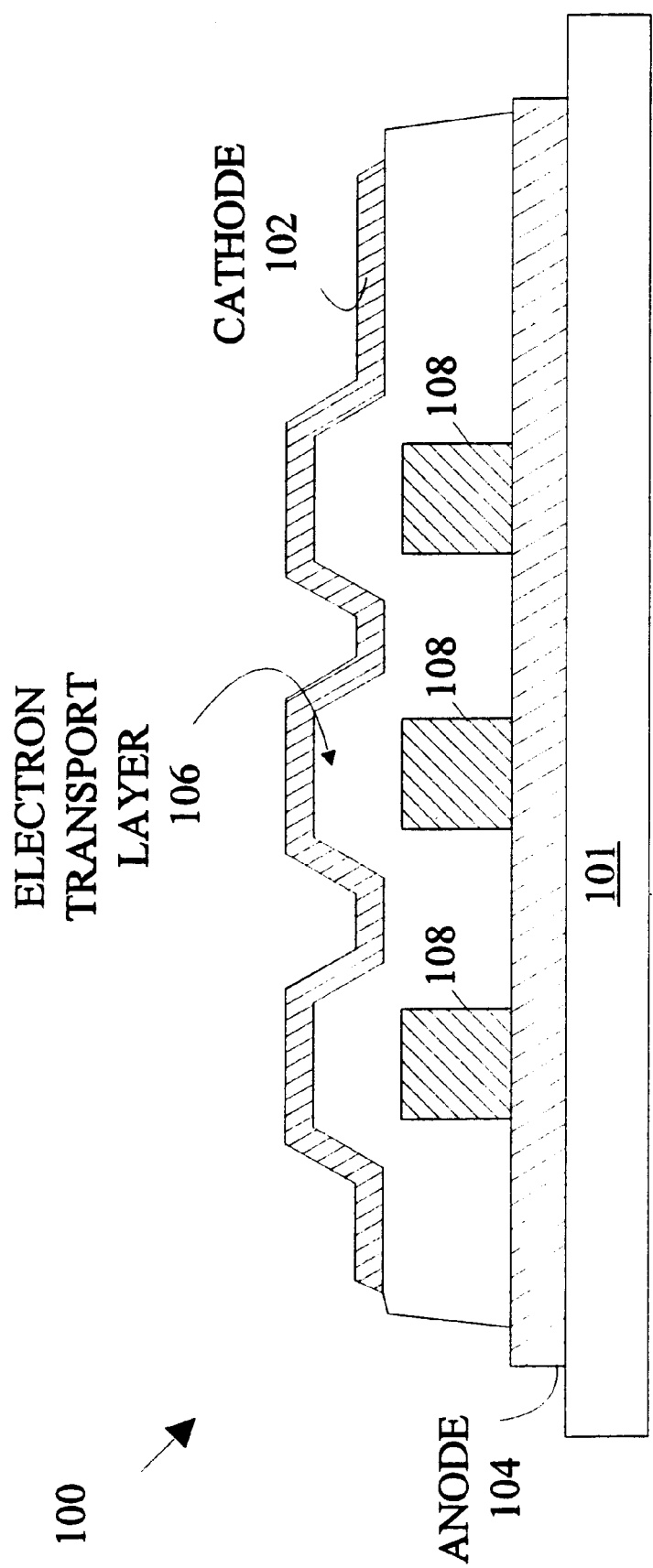
FIG. 1 is a cross-sectional view of a display according to the present invention.

The present invention will be described in terms of a PLED based display in which each pixel is a four layer structure of the type shown in FIG. 1. However, it will be apparent to those skilled in the art that from the following discussion that other pixel configurations may be used. Refer now to FIG. 1 which is a cross-sectional view of a display 100 according to the present invention. Display 100 includes a anode 104 which is transparent and through which the image is viewed. The anode is preferably constructed from indium tin oxide deposited on a transparent substrate 101. Glass is typically used for substrate 101. Each pixel includes an electroluminescent layer 108 which is covered by a electron transport layer 106. Electron transport layer 106 improves the efficiency of injection of electrons from cathode 102 into electroluminescent layer 108 by providing a material that has an energy band between that of the electroluminescent layer material and that of the cathode. Cathode 102 is preferably constructed from a metal with a low work function such as Ca, a LiAl alloy, or Mg.

While the above described embodiment of a PLED utilizes a specific geometry involving an electron transport layer, it should be emphasized that other geometries are possible. For example, a five layer structure in which a hole transport layer is sandwiched between the anode and electroluminescent layer is also known to the art. Further, embodiments in which the hole transport layer and/or electron transport layer are absent are also known to the art. As will become apparent from the following discussion, the method of the present invention may be used in conjunction with all of these arrangements.

If the pixels of the display are to be individually addressable, the electrodes are typically patterned to form rows and columns. For example, bottom electrodes may be patterned in rows and the top electrodes in columns. An individual pixel in the display is then addressed by connecting the corresponding row and column.

As noted above, a plurality of electroluminescent materials must be used for the various pixels to provide a multicolor display. The present invention makes use of the observation that there are electroluminescent materials that are soluble in solvents that are compatible with dispensing systems that can accurately dispense small amounts of the solvents at precise locations. For example, the three primary colors may be generated from polyflourenes dissolved in an appropriate solvent with dopants to provide the colors. These compounds may be dissolved in xylene. The color is determined by the dye used in the doping. Examples of suitable electroluminescent materials are known to those skilled in the art. The reader is referred to "Electroluminescence of doped organic thin films", Tang, et al., J. Applied Physics 55, pp 3610, 1989, which is hereby incorporated by reference, for a more detailed list of suitable materials. For example, the Coumarins and DCM compounds disclosed therein provide emissions in the blue-green and orange-red portions of the spectrum, respectively.

To simplify the following discussion, a fabrication method based on a dispensing system that is analogous to the mechanism used in inkjet printers will be described. Other forms of dispensers will be discussed in more detail below. An inkjet printer dispenses small droplets by vaporizing part of the liquid and using the vaporized liquid to propel the droplet toward the receiving surface. Resolutions of 300 droplets per inch are commonly achieved with inexpensive printer mechanisms.

Figure 2:
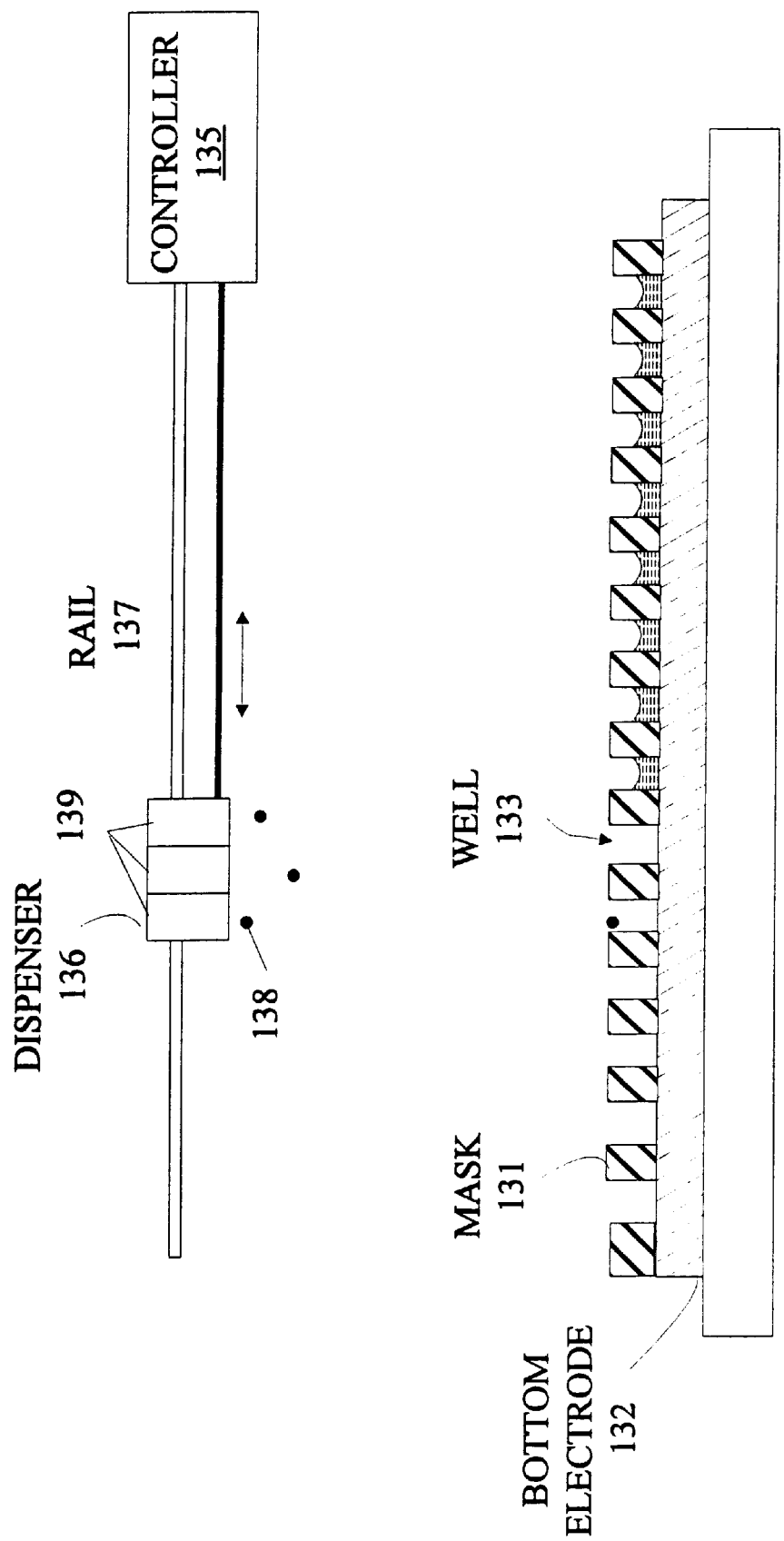
FIG. 2 illustrates the fabrication of a display according to the present invention.

Refer now to FIG. 2 which illustrates the fabrication of a display according to the present invention. The locations of the pixels are defined by a single mask 131 which is deposited on top of the bottom electrode 132 which may be the anode or the cathode shown in FIG. 1. The mask may be generated by conventional photo-resist masking techniques. Each pixel location consists of a well which is to receive a droplet of electroluminescent material. An exemplary well is shown at 133. The droplets 138 are dispensed into the wells by a dispenser 136 which moves with respect to the display being fabricated on a rail 137. As noted above, dispenser 136 includes a plurality of reservoirs 139, one for each electroluminescent material to be dispensed. The electroluminescent materials are preferably electroluminescent dyes that are dissolved in a carrier liquid. In the embodiment shown in FIG. 2, three reservoirs are utilized. As the reservoirs pass over the wells, controller 135 dispenses droplets into the well in accordance with a predetermined pattern that is stored in controller 135. In essence, controller 135 prints the pixel pattern on the masked bottom electrode. Mask 131 prevents the droplets from running into one another.

After the droplets have dried, mask 131 is removed leaving the isolated electroluminescent pixels. The area between the pixels and over the pixels is filled with a electron or hole transport material to facilitate the injection of charges into the electroluminescent layers. In a co-pending patent application (U.S. Ser. No. 08/813,962 filed Mar. 3, 1997 now U.S. Pat. No. 5,965,280), the manner in which the hole and/or electron transport layer is constructed is discussed in detail. The reader is directed to that patent application which is hereby incorporated by reference for a detailed discussion of the relationship between the hole transport layer thickness and the height of the electroluminescent pixels. For the purposes of the present discussion, it is sufficient to note that the thickness of the transport layer may be chosen such that the transport layer also electrically isolates the anode and cathode in those regions not containing electroluminescent material.

Alternatively, the photoresist mask may be left in place and transport layer applied over it. In this case the mask provides the electrical isolation between the individual pixels. This alternative has the advantage of eliminating one processing step.

Finally, the top electrode is deposited. In embodiments in which the pixels are individually addressed, the cathode and anode are typically constructed as strips running at right angles with respect to one another to form a plurality of rows and columns. Each pixel is then addressed by powering the row and column electrodes connected to that pixel. In embodiments in which a fixed "picture" is displayed by the device, the cathode and anode can be constructed as uniform conductive sheets.

For advertising purposes, an electroluminescent display which generates a fixed image analogous to a transparency that is back illuminated would be advantageous if such a display can be provided inexpensively. The method of the present invention can be used to provide such a display. In such an embodiment, each pixel is constructed from a mixture of the electroluminescent materials. The ratio of the materials is set pixel by pixel to provide the desired color for that pixel when the pixel is powered. Such a display utilizes a continuous cathode and anode. In this case, a fourth "dye" or filler material is utilized to fill those pixel locations that are not to generate light. This filler material fills the wells in the mask thereby assuring that the top surface on which the transport layer and top electrode is deposited is more nearly planar. Otherwise it is constructed in a manner identical to that described above. When a voltage is applied across the anode and cathode, the device generates the desired image.

While the above described embodiments utilized an inkjet printer mechanism for dispensing the electroluminescent dyes, it will be apparent to those skilled in the art from the above discussion that other dispensers may be utilized without departing from the teachings of the present invention. For example, dispensers based on vibrating nozzles are known to the art. In these devices, the liquid leaving the vibrating nozzle breaks up into small droplets which are deflected by an electrostatic field. Similarly, dispensers based on micro-pipettes are known in the art. Other ink dispensers such as used in pen plotters may also be utilized.

Likewise dispensers comprising an array of micro-pipettes for replicating a pattern stored in a two dimensional array of wells are known in the liquid handling arts utilized by biochemistry and microbiology. In this case, the pattern of pixels is stored in the master array of wells and is replicated on each of the devices utilizing the array of micro-pipettes. This technology is most applicable for displays having large pixels.

The above described embodiments of the present invention utilized walls to confine the droplets of electroluminescent materials. However, it will be apparent to those skilled in the art from this discussion that other forms of containment can be utilized. For example, the surface on which the droplets are deposited can be arranged in a plurality of hydrophilic or hydrophobic regions so that the droplets are confined by surface tension.

The above described embodiments of the present invention have utilized "pixels" which are in the form of dots.

However, other configurations can be utilized. For example, display elements that are lines or more complex structures can also be utilized. Such complex elements can be used as sub-images or components of images.

Various modifications to the present invention will become apparent to those skilled in the art from the foregoing description and accompanying drawings. Accordingly, the present invention is to be limited solely by the scope of the following claims.

What is claimed is:

1. An electroluminescent display comprising:

a continuous transparent bottom electrode;

a continuous top electrode;

a plurality of pixels located between said top and bottom electrodes, said plurality of pixels including first and second pixels, said first pixel comprising a first mixture of at least two electroluminescent dyes and said second pixel comprising a second mixture of said at least two electroluminescent dyes, said first mixture differing in the ratios of said electroluminescent dyes from said second mixture.

2. The electroluminescent display of claim 1 wherein a third one of said pixels comprises a compound that does not emit light.

* * * * *